United States Patent
Menut

(10) Patent No.: US 6,812,541 B2
(45) Date of Patent: Nov. 2, 2004

(54) INTEGRATED CIRCUIT WITH A REDUCED RISK OF PUNCH-THROUGH BETWEEN BURIED LAYERS, AND FABRICATION PROCESS

(75) Inventor: Olivier Menut, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/250,538
(22) PCT Filed: Jan. 9, 2002
(86) PCT No.: PCT/FR02/00055
§ 371 (c)(1),
(2), (4) Date: Dec. 2, 2003
(87) PCT Pub. No.: WO02/056363
PCT Pub. Date: Jul. 18, 2002

(65) Prior Publication Data
US 2004/0075107 A1 Apr. 22, 2004

(30) Foreign Application Priority Data
Jan. 12, 2001 (FR) .............................. 01 00412

(51) Int. Cl.$^7$ .............................................. H10L 29/00
(52) U.S. Cl. ........................ 257/513; 257/374; 438/424
(58) Field of Search ................................ 257/374, 513, 257/510; 438/424

(56) References Cited

U.S. PATENT DOCUMENTS
4,829,359 A * 5/1989 O et al. ...................... 257/374

FOREIGN PATENT DOCUMENTS
JP          63312669       * 12/1988

* cited by examiner

*Primary Examiner*—Douglas Wille
(74) *Attorney, Agent, or Firm*—Lisa K. Jorgenson; Jose Gutman; Fleit, Kain, Gibbons, Gutman, Bongini & Bianco P.L.

(57) ABSTRACT

The semiconductor substrate of the integrated circuit includes at least one dielectrically isolating, vertical buried trench (2) having a height at least five times greater than its width, the trench laterally separating two regions (4, 5), and an epitaxial semiconductor layer (6) coveting the trench. An application is advantageously suited to MOS, CMOS and BiCMOS technologies.

25 Claims, 1 Drawing Sheet

INTEGRATED CIRCUIT WITH A REDUCED RISK OF PUNCH-THROUGH BETWEEN BURIED LAYERS, AND FABRICATION PROCESS

CROSS-REFERENCE TO RELATED APPLICATIONS

This application is the National Stage of International Application No. PCT/FR02/00055 filed on Jan. 9, 2002, which is based upon and claims priority from prior French Patent Application No. 0100412 filed Jan. 12, 2001, the entire disclosure of which is herein incorporated by reference.

BACKGROUND OF THE INVENTION

1. Field of the Invention

The present invention relates to the fabrication of integrated circuits. It is more particularly appropriate for the production of MOS or complementary MOS devices or the fabrication of bipolar transistors and complementary MOS transistors (BiCMOS) in the same semiconductor substrate.

2. Description of Related Art

In the fabrication of bipolar or MOS components, buried layers are firstly formed in the semiconductor substrate, generally made of silicon, these buried layers subsequently playing a specific role according to the component produced. Thus, the buried layers may especially be collectors for bipolar transistors, or else well bottom contacts for MOS transistors. These buried layers are characterized by their p-type or n-type doping so as to meet the specificities of the components that it is desired to produce (an npn or pnp bipolar transistor or an nMOS or pMOS transistor). Within the same semiconductor device, it is possible to encounter two adjacent MOS transistors of different conductivity (CMOS), two adjacent MOS transistors of the same conductivity separated by a region of opposite conductivity, and MOS transistors and bipolar transistors (BiCMOS).

Although being constituent elements of separate components, the buried layers within the same substrate cannot be doped independently of one another. This is because the doping levels of the buried layers determine, in particular, parasitic phenomena such as the breakdown voltage between p-type and n-type layers, and the punch-through voltage between layers of the same type of conductivity.

Thus, for example, the breakdown voltage between two layers of opposite conductivity is lower the greater the doping gradient between these layers. This is generally the case when the buried layers are highly doped.

Moreover, the risk of punch-through between buried layers of the same type is higher the shorter the distance separating the two layers. The separating region of opposite conductivity, which is not highly doped and is becoming narrower and narrower, can no longer fulfil its role of providing isolation between the two buried layers of the same type. The miniaturization of the integrated circuits necessarily leads to an increase in this risk.

To remedy the problem of punch-through, it would be conceivable to reduce the doping level of the layers of the same kind and increase that of the layers of opposite conductivity which separate them. This would in particular have the consequence of limiting the diffusion of the dopants from the highly doped layers into the lightly doped isolating layers. However, modification of the doping levels of the buried layers would also modify the intrinsic operation of the desired devices. Furthermore, if the doping of the separating layers is increased, there is also a risk of lowering the breakdown voltages.

With the reduction in size of the components and integrated circuits, it will become increasingly complicated to obtain a satisfactory compromise between the intrinsic operation of the devices and their isolation.

There is therefore a need to overcome these parasitic phenomena caused by the proximity of the components, and especially the contiguity of the buried layers.

More particularly, it seems to be necessary to provide solutions for minimizing, or indeed eliminating, the risk of punch-through of the buried layers and the lowering of the breakdown voltages, while still maintaining the proper intrinsic operation of the components produced.

SUMMARY OF THE INVENTION

The Applicant provides a solution which allows these problems to be remedied.

The invention essentially consists of the formation of buried trenches which laterally isolate, from one another, the buried layers of identical or different conductivities. In particular, it has been found that it is possible to prevent the immediate punch-through of the buried layers by adding such trenches in the semiconductor substrate between the layers. These trenches are positioned so as to separate the buried layers of different or identical conductivity from one another. These trenches form an obstacle to the diffusion of the dopants from one buried layer to another, and they also reduce the risk of lowering the breakdown voltage.

The proper intrinsic operation of the components is ensured because of independent doping of the buried layers of the device.

Thus, the invention provides an integrated circuit comprising a semiconductor substrate, for example made of silicon, including at least one dielectrically isolating, vertical buried trench having a height at least five times greater than its width, said trench laterally separating two regions, and an epitaxial semiconductor layer, for example made of single-crystal silicon, covering said trench.

The trenches prevent the diffusion of dopants through them, or else ensure galvanic isolation.

The trench must be narrow enough to allow the growth of a homogeneous epilayer over the entire surface of the semiconductor wafer. Preferably, the width of these trenches is less than 1 $\mu$m, more preferably less than 0.3 $\mu$m and more particularly about 0.2 $\mu$m.

The depth of the trenches may vary depending on the requirement of the semiconductor device produced within the substrate.

As an indication, a trench may have a width of 0.2 microns and a height of greater than 5 microns, and may be buried at a depth of at least 0.8 microns.

Advantageously, the invention applies when there are at least three n, p and n or p, n and p adjacent buried layers, especially when it is desired to produce two MOS transistors of the same kind, the buried layers of which are separated by a region of opposite conductivity, or else in the case of BiCMOS technology since, in this situation, the risk of immediate punch-through of the buried layers may be high. The formation of narrow trenches, in order to laterally isolate the buried layers from one another, allows this risk to be greatly reduced or even eliminated.

Thus, according to one embodiment, the substrate includes at least two buried trenches and at least three adjacent buried regions of alternating conductivity, each of these buried regions being laterally separated from the region which is adjacent to it by a trench.

The substrate may include, approximately above the three buried regions of alternating conductivity, three epitaxial regions, having the same types of conductivity as the three buried regions respectively, and the circuit may include two MOS transistors of the same kind which are formed in the two epitaxial regions having the same type of conductivity.

As a variant, the circuit may include two MOS transistors of different kind which are formed in the two epitaxial regions having two different types of conductivity, respectively.

It may also furthermore include a bipolar transistor formed in the third epitaxial region.

The subject of the invention is also a process for fabricating an integrated circuit, comprising the formation of at least one dielectrically isolating, vertical buried trench in the semiconductor substrate of the circuit, said trench having a height at least five times greater than its width and laterally separating two regions, and the formation of an epitaxial semiconductor layer covering said trench.

The two regions may have conductivities of different type, which are obtained by implantation of dopants.

According to one method of implementation:

a) said trench is formed in the substrate;
b) the two regions having the same type of conductivity or else having two different types of conductivity are formed on each side of the trench by implantation;
c) an annealing operation is carried out; and
d) said epitaxial layer is grown, by epitaxy, on the structure obtained in step c).

The trench is preferably formed before the implantation of dopants in those regions of the substrate which are intended to subsequently form the buried layers. This is because, after this moment in the process, the thermal budget is less but there is less of a risk of the dopants diffusing from one layer to another. However, it may be envisaged to etch the trenches after implantation in specific cases that could require certain devices.

This implantation step is usually followed by an annealing operation in order to make the dopants diffuse, particularly over a thickness of preferably less than the depth of the trenches.

According to one method of implementation, a first single-crystal silicon layer is then grown epitaxially over the entire surface of the substrate. The very small size of the trenches allows almost homogeneous single-crystal silicon growth over the entire surface of the substrate.

It is possible to form, in this epitaxial single-crystal silicon layer, regions of the same conductivity as those of the subjacent buried layers and it is then advantageous to carry out an annealing operation so that there is continuity between the dopant in this epitaxial region and that in the buried region.

According to one method of implementation, prior to step b), the trenches are filled with a dielectric, preferably silicon oxide. It would also be possible to use nitride compounds or "insulator+conductor" compounds such as, for example, silicon dioxide+polysilicon.

The process of the invention may advantageously be implemented in order to produce contiguous MOS and/or bipolar transistors, especially in BiCMOS and CMOS technologies.

BRIEF DESCRIPTION OF THE DRAWINGS

The rest of the description refers to the appended figures, respectively FIGS. 1a to 1d, which show schematically the main steps of particular methods of implementing the process of producing a semiconductor device incorporating narrow buried trenches according to the invention. These particular methods of implementation of the process of the invention are in no way limiting.

DETAILED DESCRIPTION OF PREFERRED EMBODIMENTS

Figure 1A:
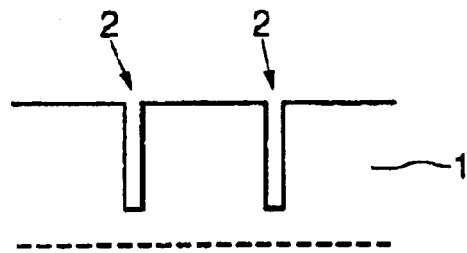
Figure 1B:
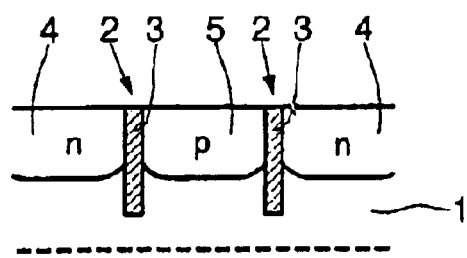

The integrated circuit produced according to the methods of implementation illustrated in FIGS. 1a to 1b includes components requiring contiguity of three buried layers, the central one of which has a first type of conductivity and two lateral ones have a second type of conductivity. Of course, the invention is not limited to this particular situation, rather it also encompasses especially the contiguity of two buried layers of different conductivity or the contiguity of more than three buried layers.

According to the process of the invention, the position on a semiconductor substrate 1, generally made of silicon, of the various regions of implantation of n- or p-type dopants, these regions subsequently forming the buried layers, is determined beforehand in a conventional manner.

According to a preferred method of implementing the process of the invention, and as illustrated in FIG. 1a, trenches 2 are then etched at the position of the junctions between these various regions. These trenches 2 may be deep or shallow. Their size depends essentially on the subsequent implantation and the thickness of the buried layers, on the annealing operations and therefore, more generally, on the component that it is desired to produce.

If their depth can vary, the width of the trenches 2 constitutes an important parameter. This is because the trenches 2 must be wide enough so that, on the one hand, they can be formed technically and can be filled uniformly with a dielectric and, on the other hand, they can fulfil their role of providing isolation between two layers of different conductivity. Furthermore, the trenches 2 must be narrow enough to allow the growth of a homogeneous epitaxial layer of single-crystal silicon over the entire surface of the wafer.

The width of the trenches 2 according to the process of the invention is preferably less than 1 $\mu$m and even more preferably less than 0.3 $\mu$m. More particularly, according to one preferred method of implementing the invention, the trenches 2 have a width of about 0.2 $\mu$m.

Next, the trenches 2 are filled with a dielectric 3. It will be preferable to use silicon oxide as isolating material in the trenches.

As illustrated in FIG. 1b, regions of different conductivity are then formed on each side of the trenches. In the device illustrated in FIG. 1b, a region 5 of a first type of conductivity is formed between the two trenches 2. On the other side of the trenches 2, or else on the outside of the trenches 2, two regions 4 of a second type of conductivity have been formed. The doping of these regions is carried out conventionally, by ion implantation with suitable dopants (for example).

In FIG. 1b, the central region is of p-type conductivity and the lateral regions are of n-type conductivity. Conductivities which are the opposite of these regions also fall within the scope of the process of the invention. The regions 4 and 5 will constitute the buried layers of the semiconductor components produced. These buried layers may, for example, be collectors for bipolar transistors or else well bottom contacts for MOS transistors.

After doping, the process generally continues with a thermal annealing operation so that the implantation regions 4 and 5 extend, in particular, over the entire desired thickness and preferably over a thickness of less than the depth of the trenches 2.

According to a preferred method of implementing the invention, the isolating trenches are formed before implantation of the buried layers so as to prevent any diffusion of dopants from one region to another, especially during the annealing step.

At this step of the process of the invention, the regions of different conductivity are separated from one another by isolating trenches, as illustrated in FIG. 1b. The lateral diffusions of the regions 4 and 5 are limited. There is no compensating of the dopants between these various regions. Furthermore, the highly doped parts are no longer in contact with one another, as they would be previously without the trenches. A dielectric wall separates the highly doped buried layers, which results in an increase in the breakdown voltages and therefore a higher performance of the semiconductor components produced.

Moreover, according to the process of the invention, it is now possible to dope the buried layers independently of one another, thereby adding an additional degree of freedom in the production of components. This is because the choice of doping level now depends only on the nature of the components that it is desired to produce and it respects their intrinsic operation.

A first single-crystal silicon layer 6 is then grown epitaxially over the entire wafer. This layer 6 grows on the surface of the substrate 1 and of the trenches 2 by vertical and lateral epitaxial growth.

Figure 1C:
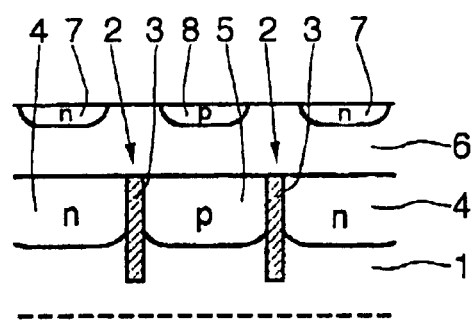

As illustrated in FIG. 1c, implantations in this first epitaxial layer 6, and approximately above each of the regions formed in the previous step, are then produced in order to form regions of the same conductivity. Thus, the layer 8 is of the first type of conductivity and the layers 7 are of the second type of conductivity, corresponding to the layers 5 and 4 respectively.

After this implantation, a thermal annealing operation is carried out so that the layers 7 and 8 extend in particular over the entire thickness of the epitaxial layer 6.

Figure 1D:
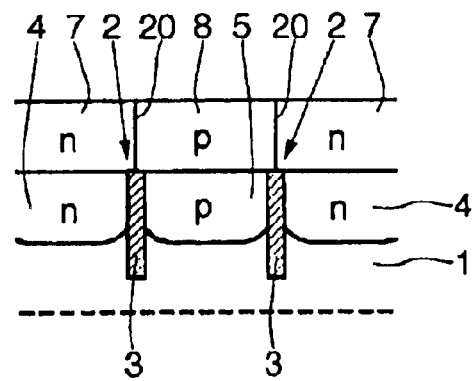

As illustrated in FIG. 1d, the doping operations were carried out so that the central region 8 is p-doped and the lateral regions 7 are n-doped. The doping of the epitaxial layer depends on the conductivity of the buried layers or on the semiconductor device to be produced. The opposite conductivity to the situation illustrated also falls within the scope of the invention.

According to the process of the invention, the desired semiconductor components are then formed in the epitaxial layers of different conductivity using standard processes.

As an entirely nonlimiting example, it may be envisioned to produce several types of semiconductor devices from the device illustrated in FIG. 1d.

According to a first variant, two pMOS transistors may be produced in the n-type epitaxial regions 7. The n-doped buried layers 4 then constitute the well bottom contacts for these transistors. The central p-type region constitutes a separating region of opposite conductivity.

According to another variant, it may be envisioned to produce a pMOS transistor on an epitaxial region 7 in the same way. In the other, n-doped, epitaxial region 7, it may be envisioned to produce an npn bipolar transistor, in which case the n-type buried layers 4 will constitute the well bottom contact of the MOS transistor and the collector of the bipolar transistor, respectively. The p-doped central region consisting of the layers 5 and 8 may then serve as base for the production of an nMOS transistor.

These various devices are isolated from one another by the junction 20 and by the depthwise dielectric isolation 3.

The process of the invention is particularly suitable for the production of transistors in MOS, CMOS or BiCMOS technology.

The semiconductor devices produced according to the process of the invention exhibit better breakdown behavior and a considerably reduced, if not nonexistent, immediate punch-through of the buried layers is observed.

The invention also applies to power devices, by allowing depthwise dielectric isolation.

It also applies to sensor devices, preventing lateral leakage currents from deep junctions.

What is claimed is:

1. An integrated circuit comprising:
   a semiconductor substrate, wherein the semiconductor substrate includes:
      at least one trench, being dielectrically isolating, vertically buried, and having a height at least five times greater than its width, and wherein each of the at least one trench laterally separating two regions (4, 5) of the semiconductor substrate; and
   an epitaxial semiconductor layer covering the at least one trench.

2. The integrated circuit according to claim 1, wherein the semiconductor substrate is formed from single-crystal silicon.

3. The integrated circuit according to claim 2, wherein the semiconductor substrate includes at least two buried trenches and at least three adjacent buried regions of alternating conductivity, each of these buried regions being laterally separated from the region which is adjacent to it by a trench.

4. The integrated circuit according to claim 1, wherein the width of the trench is less than 0.3 microns.

5. The integrated circuit according to claim 1, wherein the two regions having conductivities of different type.

6. The integrated circuit according to claim 5, wherein the width of the trench is less than 0.3 microns.

7. The integrated circuit according to claim 5, wherein the semiconductor substrate is formed from single-crystal silicon.

8. The integrated circuit according to claim 7, wherein the width of the trench is less than 0.3 microns.

9. The integrated circuit according to claim 7, wherein the trench has a width of 0.2 microns and a height of greater than 5 microns and in that it is buried at a depth of at least 0.8 microns.

10. The integrated circuit according to claim 1, wherein the semiconductor substrate includes at least two buried trenches and at least three adjacent buried regions of alternating conductivity, each of these buried regions being laterally separated from the region which is adjacent to it by a trench.

11. The integrated circuit according to claim 10, wherein the substrate includes, approximately above the three buried regions of alternating conductivity, three epitaxial regions, having the same types of conductivity as the three buried regions respectively, and in that the circuit includes two MOS transistors of the same kind which are formed in the two epitaxial regions having the same type of conductivity.

12. The integrated circuit according to claim 10, wherein the substrate includes, approximately above the three buried regions of alternating conductivity, three epitaxial regions, having the same types of conductivity as the three buried regions respectively, and in that the circuit includes two MOS transistors of different kind which are formed in the two epitaxial regions having two different types of conductivity, respectively.

13. The integrated circuit according to claim 12, further comprising a bipolar transistor formed in the third epitaxial region.

14. A process for fabricating an integrated circuit, comprising the steps of:
  forming at least one dielectrically isolating, vertically buried trench in a semiconductor substrate of an integrated circuit, each of the at least one trench having a height at least five times greater than its width and laterally separating two regions of the semiconductor substrate; and
  forming an epitaxial semiconductor layer covering the at least one trench.

15. The process according to claim 14, wherein the width of the at least one trench is less than 0.3 microns.

16. The process according to claim 14, wherein the semiconductor substrate being made of silicon:
  a) the at least one trench is formed in the semiconductor substrate;
  b) the two regions having conductivity of one of the same type of conductivity for the two regions and two different types of conductivity for the two regions, and being formed on each side of the at least one trench by implantation;
  c) an annealing operation being carried out; and
  d) the epitaxial layer being grown, by epitaxy, on the structure obtained in step c).

17. The process according to claim 16, wherein prior to step b) each of the at least one trench is filled with a dielectric, preferably silicon oxide.

18. The process according to claim 14, wherein the two regions have conductivities of different type, which are obtained by implantation of dopants.

19. The process according to claim 18, wherein the width of the at least one trench is less than 0.3 microns.

20. The process according to claim 18, wherein the semiconductor substrate being made of silicon:
  a) the at least one trench is formed in the semiconductor substrate;
  b) the two regions having different types of conductivity for the two regions, and being formed on each side of the at least one trench by implantation;
  c) an annealing operation being carried out; and
  d) the epitaxial layer being grown, by epitaxy, on the structure obtained in step c).

21. The process according to claim 20, wherein prior to step b) each of the at least one trench is filled with a dielectric, preferably silicon oxide.

22. The process according to claim 14, wherein at least two buried trenches and at least three adjacent buried regions of alternating conductivity are formed in the substrate, each of these buried regions being laterally separated from the region which is adjacent to it by a trench, and in that three epitaxial regions are formed in the epitaxial layer, approximately above the three buried regions of alternating conductivity, these epitaxial regions having the same types of conductivity as the three buried regions respectively.

23. The process according to claim 22, wherein two MOS transistors of the same kind are formed in the two epitaxial regions having the same type of conductivity.

24. The process according to claim 22, wherein two MOS transistors of different kind are formed in the two epitaxial regions having two different types of conductivity, respectively.

25. The process according to claim 24, wherein a bipolar transistor is furthermore formed in the third epitaxial region.

* * * * *